United States Patent

Nam et al.

[11] Patent Number: 5,855,077
[45] Date of Patent: Jan. 5, 1999

[54] APPARATUS FOR DRYING SEMICONDUCTOR WAFERS USING ISOPROPYL ALCOHOL

[75] Inventors: Chang-Hyun Nam, Kyungki-do; Yong-Sun Ko, Suwon, both of Rep. of Korea

[73] Assignee: Samsung Electronics Co., Ltd., Suwon, Rep. of Korea

[21] Appl. No.: 759,566

[22] Filed: Dec. 4, 1996

[30] Foreign Application Priority Data

Dec. 4, 1995 [KR] Rep. of Korea ................ 1995-46458

[51] Int. Cl.⁶ .................................................... F26B 5/04
[52] U.S. Cl. ................................... 34/409; 34/75; 34/76; 34/92; 34/418
[58] Field of Search ................................. 34/78, 73, 74, 34/75, 92, 418

[56] References Cited

U.S. PATENT DOCUMENTS 5,249,371 10/1993 Saito et al. ................................... 34/78
5,315,766 5/1994 Roberson, Jr. et al. ................... 34/409
5,351,419 10/1994 Franka et al. .............................. 34/470

*Primary Examiner*—Henry A. Bennett
*Assistant Examiner*—Pamela A. Wilson
*Attorney, Agent, or Firm*—Jones & Volentine, L.L.P.

[57] ABSTRACT

An apparatus for drying semiconductor wafers using IPA (Isopropyl Alcohol) vapor includes a first chamber for producing the IPA vapor, and a second chamber connected to the first chamber through an IPA supply line, for receiving the IPA vapor and drying semiconductor wafers using the IPA vapor. With the drying apparatus, the first and second chambers are separated from each other, which allows the process steps of producing the IPA vapor and the drying the wafers to be separately performed. The drying apparatus thus prevents particles from being generated in the second chamber during the drying process. The wafers can be dried without a variation in temperature in the second chamber. The IPA vapor is exhausted from the second chamber by introducing nitrogen into the second chamber. As a result, the IPA vapor in the second chamber is not liquified and thereby leaves no substance to adhere to a contact portion between a wafer carrier and each wafer.

12 Claims, 2 Drawing Sheets

APPARATUS FOR DRYING SEMICONDUCTOR WAFERS USING ISOPROPYL ALCOHOL

BACKGROUND OF THE INVENTION

1. Field of the Invention

The present invention relates to a semiconductor fabrication apparatus used for cleaning semiconductor wafers, and more particularly, this invention relates to a wafer drying apparatus for drying semiconductor wafers after cleaning them.

2. Description of the Related Art

The high degree of integration in semiconductor devices has necessitated the development of a variety of wafer cleaning techniques, which are very important in the field of semiconductor fabrication. Since, in fabricating semiconductor devices with highly integrated and fine configurations, contamination materials such as, particles remaining on the wafers after cleaning, electrostatic discharge, and water marks or the like, all exert an undesirable influence on subsequent process steps. A wafer drying process is thus required to eliminate the contamination materials.

In recent years, the apparatus for drying wafers have included: (1) spin dryers, and (2) a drying apparatus using isopropyl alcohol (IPA). The first apparatus drys the wafers by using centrifugal force. The second apparatus drys the wafers by using a low vapor pressure of isopropyl alcohol (hereinafter, referred to as "IPA").

The spin dryer has serious problems in that the wafers may be broken due to the mechanical force of the drying technique, and/or the wafers may not be sufficiently dried as a result of the highly integrated and fine structure of the semiconductor device. Accordingly, the conventional process using IPA for drying (hereinafter, referred to as "IPA dryer") is frequently used for cleaning wafers. Such a conventional IPA dryer is shown in FIG. 1.

The conventional IPA dryer comprises a process chamber 10 in which wafers 15 are dried for about 5 to 10 minutes by IPA solution 11. The IPA solution 11 is introduced in the process chamber 10 through a supply line (not shown). In the conventional IPA dryer, the wafers 15 in a wafer carrier 14 are located in the process chamber 10 and dried by IPA vapor. The IPA vapor is produced by heating the IPA solution 11 supplied in the process chamber 10 by means of a heater 16.

After the completion of the drying process in the process chamber 10, the IPA solution 11 remaining on the bottom of the chamber 10 is exhausted through an exhaust valve 13b, which is in turn connected to an exhaust line 13. The exhausted IPA solution is collected in a collecting tank (not shown). At the same time, residual products including condensed IPA vapor on the condensed vapor collecting plate 12 are exhausted through the exhaust valve 13a into the collecting tank. Reference numeral 17 in FIG. 1 represents a cooling line, which is provided to prevent the condensed IPA vapor at the top of the process chamber 10 from being exhausted outside.

When the wafer drying process is completed using the IPA vapor, the wafer carrier 14 is transported from the process chamber 10 to the outside of the chamber. The wafers in the carrier 14 are then dried in the ambient atmosphere at room temperature. With such a drying process, a problem arises in that gelled particles are continuously formed on the wafers and at the edges of the wafers. This is because the structure of the vapor zone surrounding the wafers is deformed. This deformation occurs because during repeated drying cycles, the IPA vapor rising toward the top of the process chamber is liquefied in a moment by the cooling line 17 located at the top thereof and is changed back again into IPA vapor by the heater 16. The deformation can also bring about an insufficient process of drying the wafers, which allows particles to remain on them.

In addition, since the drying cycle consisting of supplying an IPA solution into the chamber, thermal treatment, the formation of vapor, and condensation of the vapor, is continuously performed, contamination materials caused by the dryer itself may produce many particles on wafers.

Moreover, in the conventional wafer drying apparatus, since the first drying process in the process chamber 10 is performed at a temperature of about 80° C. and the second drying process is outside of the chamber at a temperature of about 25°C., the IPA vapor adhered to the carrier 14 and the wafers during the first drying process is condensed at a relatively low temperature during the second drying process, and the IPA vapor is liquefied. The liquefied IPA compound reacts to the surrounding air during the second drying process, which can cause different defects on the edge portions of the wafers or on the carrier 14 in contact with the wafers 15.

SUMMARY OF THE INVENTION

It is therefore an object of the present invention to provide a wafer drying apparatus which has two chambers, one of which is provided for generating IPA vapor and the other of which is for drying wafers, so as to prevent particles from being generated in the drying chambers.

To achieve these and other objects and advantages, there is provided an apparatus for drying semiconductor wafers using IPA (Isopropyl Alcohol) vapor, comprising: a first chamber for producing the IPA vapor and a second chamber connected to the first chamber through an IPA supply line, for receiving the IPA vapor and drying semiconductor wafers using the IPA vapor. With the above wafer drying apparatus, particles are prevented from being generated in the second chamber for drying the wafers.

In the apparatus, the first chamber comprises means located at the bottom of the first chamber, for heating the IPA solution injected into the first chamber to produce the IPA vapor, and means for detecting a pressure in the first chamber and automatically exhausting the IPA vapor when a pressure in the first chamber is beyond a constant pressure. The second chamber comprises means for decompressing a pressure in the second chamber to a level lower than a constant pressure before receiving the IPA vapor from the first chamber, and means for introducing a nitrogen gas into the second chamber and at the same time exhausting the IPA vapor from the second chamber when drying of the wafers is completed. The apparatus for drying wafers further comprises a sensor for detecting the IPA vapor concentration in the second chamber, and continues to exhaust the IPA vapor until it is not detected in the decompressing and exhausting means by the sensor.

Also, the decompressing and exhausting means comprises an exhaust valve and a decompressing pump which is operated in accordance with an open and closed positions of the exhaust valve. The first chamber further comprises a cooling line located at the top of the first chamber, for condensing the IPA vapor to prevent it from being exhausted.

BRIEF DESCRIPTION OF ATTACHED DRAWINGS

This invention will be understood and its objects and advantages will become apparent to those skilled in the art by reference to the accompanying drawings, in which:

FIG. 1 is a schematic diagram illustrating a conventional wafer drying apparatus; and FIG. 2 is a diagram illustrating a novel wafer drying apparatus according to the present invention.

DETAILED DESCRIPTION OF PREFERRED EMBODIMENT

Figure 1:
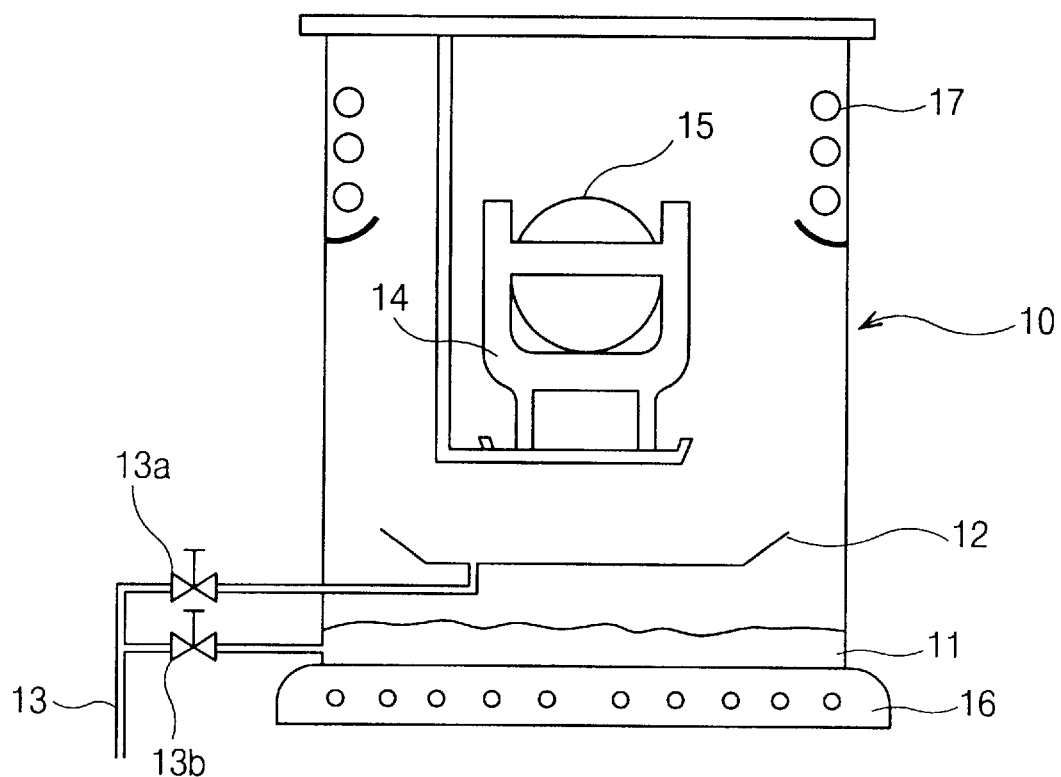
Figure 2:
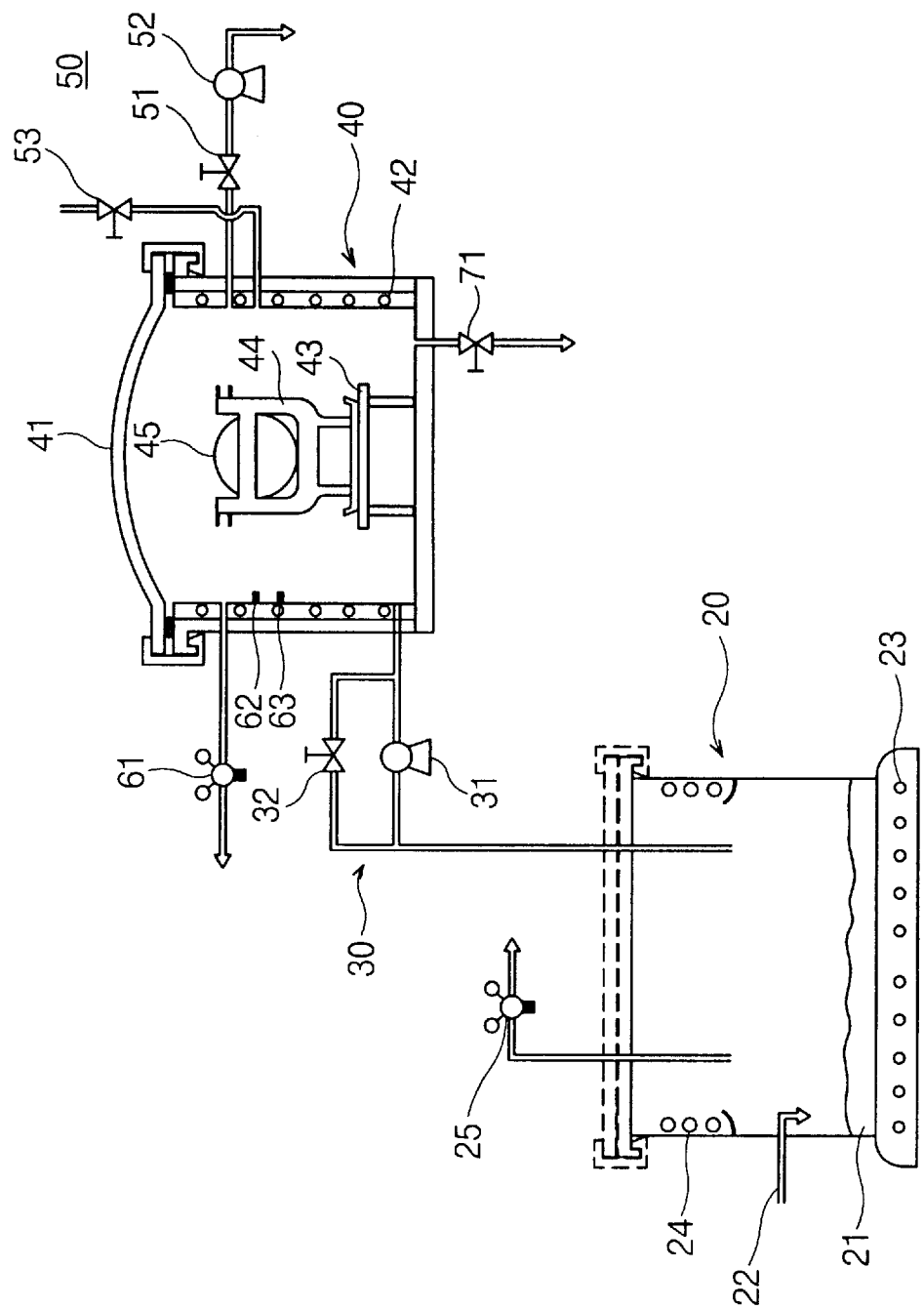

Referring to FIG. 2, a novel wafer drying apparatus in accordance with this embodiment generally includes a first chamber 20 for producing IPA (Isopropyl Alcohol) vapor, and second chamber 40 for receiving the IPA vapor from the first chamber 20 and drying semiconductor wafers therein using the IPA vapor. Because the wafer drying apparatus has the first and second chamber separated from each other, the process steps of producing the IPA vapor and the drying of the wafers can be separately performed. The apparatus can thus prevent particles from being generated in the second chamber 40 during a drying process.

Also the apparatus can dry the wafers without any temperature variation in the second chamber 40. In addition, the IPA vapor is exhausted from the second chamber by injecting a nitrogen gas into the second chamber. As a result, the IPA vapor in the second chamber 40 is not liquefied and thus there is no residual compound to adhere to a contact portion between a wafer carrier 44 and each wafer 45.

Specifically, referring again to FIG. 2, the wafer drying apparatus of this invention has a first chamber 20 for producing IPA vapor, a second chamber 40 for drying wafers using the IPA vapor from the first chamber, and an IPA vapor supply section 30 for supplying the IPA vapor from the first chamber 20 into the second chamber 40 through the supply pump 31. The IPA solution 21 introduced into the first chamber 20 via the supply line 22 is subjected to heat by the heater 23, which is mounted at the bottom of the first chamber 20, and is changed into IPA vapor. If the IPA vapor pressure exceeds a designated constant pressure, a pressure gauge 25 commences operation and exhausts the IPA vapor from the first chamber 20 to the outside until the vapor pressure is lower than the designated constant pressure, i.e., at a steady level. Reference numeral 24 in FIG. 2 represents a cooling line for preventing the IPA vapor from escaping out of the first chamber 20.

When IPA vapor is produced in the first chamber 20, the supply valve 32 opens and the supply pump 31 commences operation. The vapor in the first chamber 20 is then supplied into the second chamber 40 through the supply line 33. The wafers located in the second chamber 40 are then dried with the supplied IPA vapor.

More specifically, after the internal pressure of the second chamber 40 is lowered to a pressure of 720 mm $H_2O$ by means of a decompressing pump 52, which is operated when the exhaust valve 51 opens, the IPA vapor in the first chamber 20 begins to be rapidly supplied into the second chamber 40. The internal temperature of the second chamber 40 can be constantly maintained by a thermal wire, which is installed on the outside wall of the second chamber 40, allowing the internal temperature in the vapor zone of the second chamber 40 to remain constant. When the internal pressure in the second chamber 40 stabilizes at a constant level, the supply valve 32 will be closed to stop supplying the IPA vapor into the second chamber 40, allowing the temperature in the second chamber to remain constant.

In the meantime, when the wafer drying process in the second chamber 40 is completed, the IPA vapor and by-products are exhausted from the chamber 40 into the collecting tank (not shown) and at the same time nitrogen ($N_2$) gas flows into the second chamber 40 by controlling the nitrogen gas supply valve 53. The exhaust of the IPA vapor and by-products is carried out by means of the decompressing pump 52. In this embodiment, the supply temperature of the $N_2$ is usually set in the range of 24° C. through 60° C. While the IPA vapor in the second chamber 40 is exhausted by the decompressing pump 52, the $N_2$ gas continues to be injected in the chamber 40 until the IPA vapor therein is completely exhausted. The IPA concentration can be detected by an IPA concentration detecting sensor 63 in the second chamber 40.

As stated above, when the drying process is completed, the cap 41 of the second chamber 40 is opened and the wafer carrier 44 in the second chamber is unloaded therefrom followed by closing of the cap.

In FIG. 2, reference numerals 61 and 62 represent a pressure gauge and a temperature sensor which are respectively located in the second chamber 40. The pressure gauge 61 is provided to exhaust the IPA vapor from the chamber 40 to the outside thereof only when the internal pressure thereof exceeds a constant level and the temperature sensor 62 is provided to detect the internal temperature of the second chamber 40. Numeral 71 is an exhaust valve which is provided to exhaust the IPA solution and by-products, which remain at the bottom of the second chamber, into the collecting tank.

As described above, the wafer drying apparatus of this invention has two separate chambers, one of which is provided to generate IPA vapor and the other to dry wafers therein. Thus, the IPA vapor generating process and wafer drying process can be independently performed in the two chambers. The generation of particles can be effectively prevented in the apparatus of the present invention, as compared with a conventional wafer drying apparatus in which the vapor generating and drying cycles are performed in a single process chamber.

Furthermore, because the wafer drying process is performed in the drying chamber without any temperature variation, the generation of a variety of defects on the wafers can be prevented.

While the present invention has been particularly shown and described with reference to particular embodiments thereof, it will be understood by those skilled in the art that various changes in form and details may be effected therein without departing from the spirit and scope of the invention as defined in the appended claims and their equivalents.

What is claimed is:

1. An apparatus for drying semiconductor wafers using IPA (Isopropyl Alcohol) vapor, comprising:

a first chamber for producing the IPA vapor; and a second chamber connected to the first chamber through an IPA supply line, for receiving the IPA vapor and drying semiconductor wafers using the IPA vapor, the second chamber comprises a means for decompressing a pressure in the second chamber to a level below a predetermined constant pressure before receiving the IPA vapor from the first chamber; and a means for introducing a nitrogen gas into the second chamber, and simultaneously, exhausting the IPA vapor from the second chamber when drying of the semiconductor wafers is completed.

2. The apparatus for drying wafers as defined in claim 1, further comprising a sensor for detecting IPA vapor contamination in the second chamber, wherein the IPA vapor in the second chamber continues to be exhausted until the IPA vapor is not detected by the sensor.

3. The apparatus for drying wafers as defined in claim 1, wherein said introducing and exhausting means comprises an exhaust valve and a decompressing pump that is operated in accordance with open and closed positions of the exhaust valve.

4. The apparatus for drying wafers as defined in claim 1, wherein the pressure is lowered to 720 mm $H_2O$ before receiving the IPA vapor from the first chamber.

5. The apparatus for drying wafers as defined in claim 1, wherein the nitrogen is introduced into the second chamber at a temperature in a range of 24° C. through 60°C.

6. An apparatus for drying semiconductor wafers using IPA (Isopropyl Alcohol) vapor, comprising:

a first chamber for producing the IPA vapor comprising a heating means, located at a bottom of the first chamber, for heating an IPA solution injected into the first chamber to produce the IPA vapor; and a means for detecting a pressure in the first chamber and automatically exhausting the IPA vapor to the outside when the pressure in the first chamber exceeds a predetermined constant pressure; and a second chamber connected to the first chamber through an IPA supply line, for receiving the IPA vapor and drying semiconductor wafers using the IPA vapor.

7. The apparatus for drying wafers as defined in claim 6, wherein said second chamber comprises:

means for decompressing a pressure in the second chamber to a level below a predetermined constant pressure before receiving the IPA vapor from the first chamber; and means for introducing a nitrogen gas into the second chamber, and simultaneously, exhausting the IPA vapor from the second chamber when drying of the semiconductor wafers is completed.

8. The apparatus for drying wafers as defined in claim 7, further comprising a sensor for detecting IPA vapor contamination in the second chamber, wherein the IPA vapor in the second chamber continues to be exhausted until the IPA vapor is not detected by the sensor.

9. The apparatus for drying wafers as defined in claim 7, wherein said introducing and exhausting means comprises an exhaust valve and a decompressing pump that is operated in accordance with open and closed positions of the exhaust valve.

10. The apparatus for drying wafers as defined in claim 7, wherein the pressure is lowered to 720 mm $H_2O$ before receiving the IPA vapor from the first chamber.

11. The apparatus for drying wafers as defined in claim 7, wherein the nitrogen is introduced into the second chamber at a temperature in a range of 24° C. through 60° C.

12. The apparatus for drying wafers as defined in claim 6, wherein said first chamber further comprises a cooling line located at the top of the first chamber for condensing the IPA vapor in the first chamber to prevent the IPA vapor from being exhausted.

* * * * *